United States Patent
Shinozaki

[11] Patent Number: 5,841,731
[45] Date of Patent: Nov. 24, 1998

[54] SEMICONDUCTOR DEVICE HAVING EXTERNALLY SETTABLE OPERATION MODE

[75] Inventor: Naoharu Shinozaki, Kawasaki, Japan

[73] Assignee: Fujitsu Limited, Kawasaki, Japan

[21] Appl. No.: 862,298

[22] Filed: May 22, 1997

[30] Foreign Application Priority Data

Dec. 13, 1996 [JP] Japan ................................. 8-334273

[51] Int. Cl.⁶ ........................................... G11C 8/00
[52] U.S. Cl. .................. 365/233; 365/191; 365/201; 365/230.08
[58] Field of Search .................... 365/233, 191, 365/201, 230.08

[56] References Cited

U.S. PATENT DOCUMENTS

| | | | |
|---|---|---|---|
| 4,984,216 | 1/1991 | Toda et al. ............................. | 365/230.08 |
| 5,111,433 | 5/1992 | Miyamoto ............................... | 365/201 |
| 5,384,745 | 1/1995 | Konishi et al. ....................... | 365/230.03 |
| 5,430,680 | 7/1995 | Parris ..................................... | 365/222 |
| 5,525,331 | 6/1996 | Kim ......................................... | 365/222 |

*Primary Examiner*—David C. Nelms
*Assistant Examiner*—Hien Nguyen
*Attorney, Agent, or Firm*—Nikaido, Marmelstein, Murray & Oram LLP

[57] ABSTRACT

A semiconductor device which allows an input signal thereto to select one of N operation modes, and operates in the one of N operation modes includes a selection circuit for selecting an operation mode from the N operation modes when the input signal indicates the operation mode, and for selecting a predetermined operation mode from the N operation modes when the input signal is an undefined signal indicating none of the N operation modes. The semiconductor device further includes an internal circuit operating in an operation mode selected by the selection circuit.

11 Claims, 8 Drawing Sheets

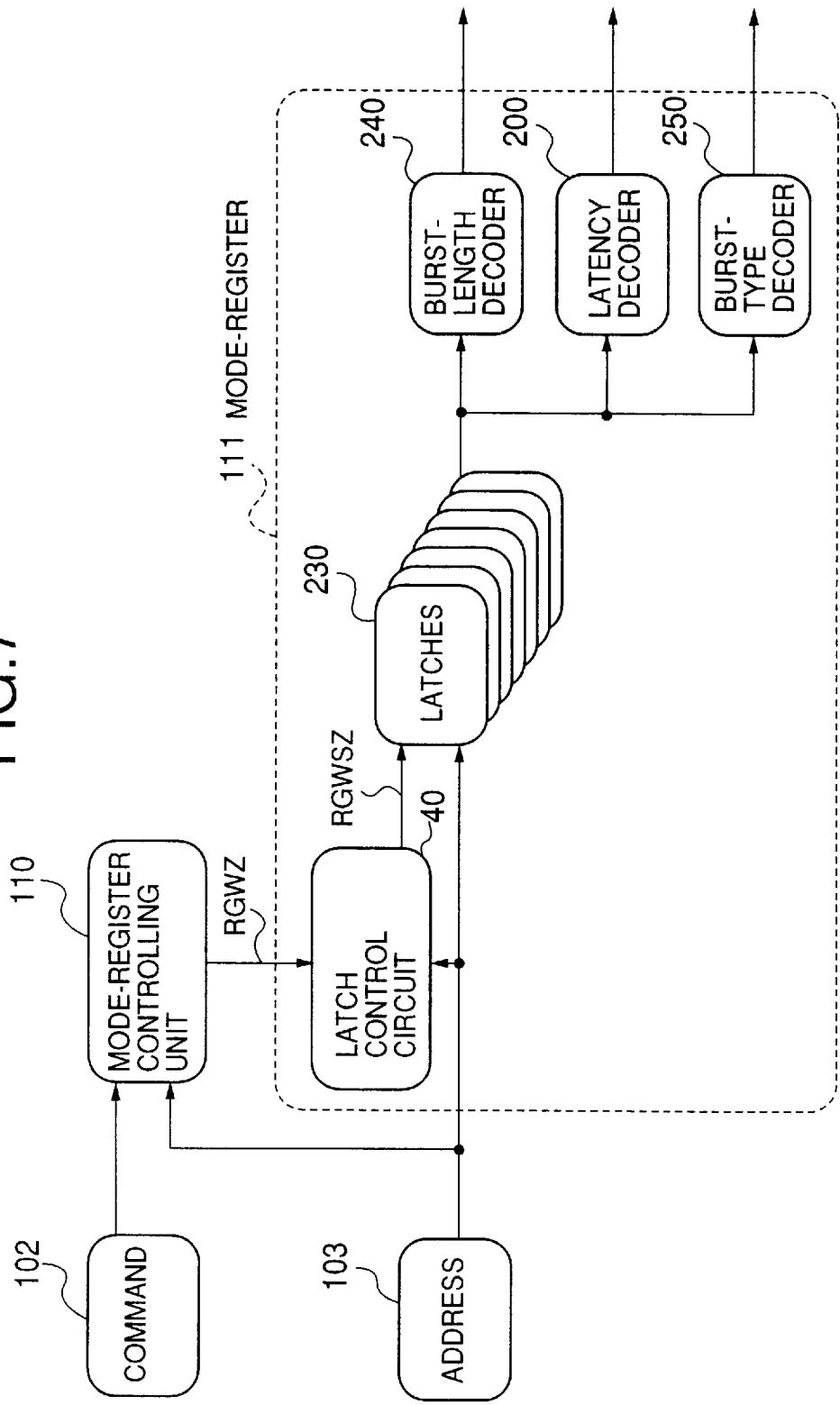

SEMICONDUCTOR DEVICE HAVING EXTERNALLY SETTABLE OPERATION MODE

BACKGROUND OF THE INVENTION

1. Field of the Invention

The present invention generally relates to semiconductor devices, and particularly relates to a semiconductor device which allows an operation mode thereof to be set via an external input.

2. Description of the Related Art

Many types of semiconductor devices are provided with a function to set an operation mode red thereof. In such semiconductor devices, parameters for setting an operation mode are typically stored in a particular register (hereinafter referred to as a mode register).

Conventional SDRAMs, for example, allow parameters for defining an operation mode of the SDRAMs to be set externally, such parameters including a CAS latency, a burst length, a burst type, etc. In setting these parameters, a mode setting operation is instructed via a command input to an SDRAM, and the parameters are input via an address input so as to write these parameters in a mode register of the SDRAM.

FIGS. 1A through 1D are illustrative drawings for explaining a mode-register-set operation with respect to a conventional 16M SDRAM. FIG. 1A shows a clock signal supplied to an SDRAM. FIGS. 1B and 1C show a command input and an address input, respectively. As shown in FIGS. 1B and 1C, a mode-register-set command MRS is input via the command input, and data is supplied to the address input to store the data in the mode register. After inputting the data, an activation command ACT is fed via the command input to put the newly set mode into effect.

FIG. 1D shows relations between the data stored in the mode register and the address input. As shown in FIG. 1D, three bits A0 through A2 of the address input together define the burst length, and a bit A3 represents the burst type. Further, three bits A4 through A6 of the address input are used for setting the CAS latency. Bits A7 through A11 are currently not in use.

Among the parameters, the CAS latency, for example, is a parameter for defining how long a start of a data-read operation is delayed in response to an input of a data-read command. The setting of the CAS latency is made by using the three bits A4 through A6 of the address input as described above. This means that eight different types of the setting can be made in principle. Settings currently in use, however, include only three or four different types, so that bit patterns of the three bits A4 through A6 include unused patterns.

FIG. 2 is a circuit diagram of a conventional latency decoder. A latency decoder is a circuit included in a mode register. The latency decoder receives three relevant bits from latches also included in the mode register for holding the address-input bits, and decodes these three bits.

A latency decoder 200 of FIG. 2 includes inverters 201 through 203, NAND circuits 204 through 207, and inverters 208 through 211. The inverters 201 through 203 receive data bits MRA4 through MRA6, respectively, which are the address-input bits A4 through A6 held by latches. Each of the NAND circuits 204 through 207 receives an non-inverted bit or an inverted bit with respect to each of the data bits MRA4 through MRA6. The inverters 208 through 211 receive outputs of the NAND circuits 204 through 207, respectively, and invert these outputs.

The outputs of the inverters 208 through 211 are denoted as decode signals CL1 through CL4, respectively, which correspond to respective bit patterns of the address-input bits A4 through A6 shown alongside in the figure. Namely, the decode signal CL1 of the inverter 208, for example, is a signal which becomes HIGH (selection) when the bits A4 through A6 are "100". In the example of FIG. 2, the latency decoder 200 has four outputs, i.e., the decode signals CL1 through CL4. When the address-input bits A4 through A6 have different bit patterns from those shown in the figure, all the decode signals CL1 through CL4 become LOW (unselected).

In this manner, all the outputs of the latency decoder 200 end up being unselected when an undefined bit pattern is input. This is not a unique outcome only for the latency decoder 200, and the same applies in other decoders in the mode register such as a burst-length decoder and a burst-type decoder.

When the CAS latency, the burst length, the burst type, etc., are set in the mode register, entry of an undefined bit pattern which is currently not in use results in all the decoder outputs from the mode register ending up being unselected. When such an undefined setting is made in a conventional semiconductor device such as an SDRAM, it is possible that the chip carries out an unexpected operation which is not cited in a catalog. Such an operation may damage some data stored in memory cells in the case of memory chips.

Accordingly, there is a need for a semiconductor device which insures a normal operation thereof even when an undefined setting is made to a mode register for setting an operation mode of the device.

SUMMARY OF THE INVENTION

Accordingly, it is a general object of the present invention to provide a semiconductor device which satisfies the need described above.

It is another and more specific object of the present invention to provide a semiconductor device which insures a normal operation thereof even when an undefined setting is made to a mode register for setting an operation mode of the device.

In order to achieve the above objects according to the present invention, a semiconductor device which allows an input signal thereto to select one of N operation modes, and operates in the one of the N operation modes, includes a selection circuit for selecting an operation mode from the N operation modes when the input signal indicates the operation mode, and for selecting a predetermined operation mode from the N operation modes when the input signal is an undefined signal indicating none of the N operation modes. The semiconductor device further includes an internal circuit operating in an operation mode selected by the selection circuit.

In the semiconductor device described above, when an undefined signal is input, one of the N operation modes is selected to prevent an undefined setting from causing an unexpected operation of the semiconductor device.

According to an embodiment of the present invention, the selection circuit includes a first circuit for selecting one of predetermined N−1 operation modes among the N operation modes based on the input signal, while a remaining operation mode is selected when this first circuit does not select any one of the N−1 operation modes. In this configuration, an undefined input leads to a selection of the remaining operation mode, thereby preventing an undefined setting from causing an unexpected operation of the semiconductor device.

According to an embodiment of the present invention, a second circuit for selecting the remaining operation mode based on an output from the first operation mode is provided in proximity of or within the internal circuit. This configuration reduces the number of signal lines from N lines to N−1 lines with respect to the signal transfer of a selected operation mode from the first circuit to the internal circuit.

According to an embodiment of the present invention, the selection circuit includes a circuit for storing the input signal, and a currently stored input signal in this circuit is not updated when an undefined input is given, thereby preventing an undefined setting from causing an unexpected operation of the semiconductor device.

The same objects are also achieved by an equivalent method of selecting one of a plurality of operation modes in a semiconductor device.

Other objects and further features of the present invention will be apparent from the following detailed description when read in conjunction with the accompanying drawings.

BRIEF DESCRIPTION OF THE DRAWINGS

FIG. 7 is a block diagram showing a mode resister and relating elements in an SDRAM according to a second embodiment of the present invention;

DESCRIPTION OF THE PREFERRED EMBODIMENTS

In the following, principles of the present invention will be described with reference to the accompanying drawings.

Figure 3:
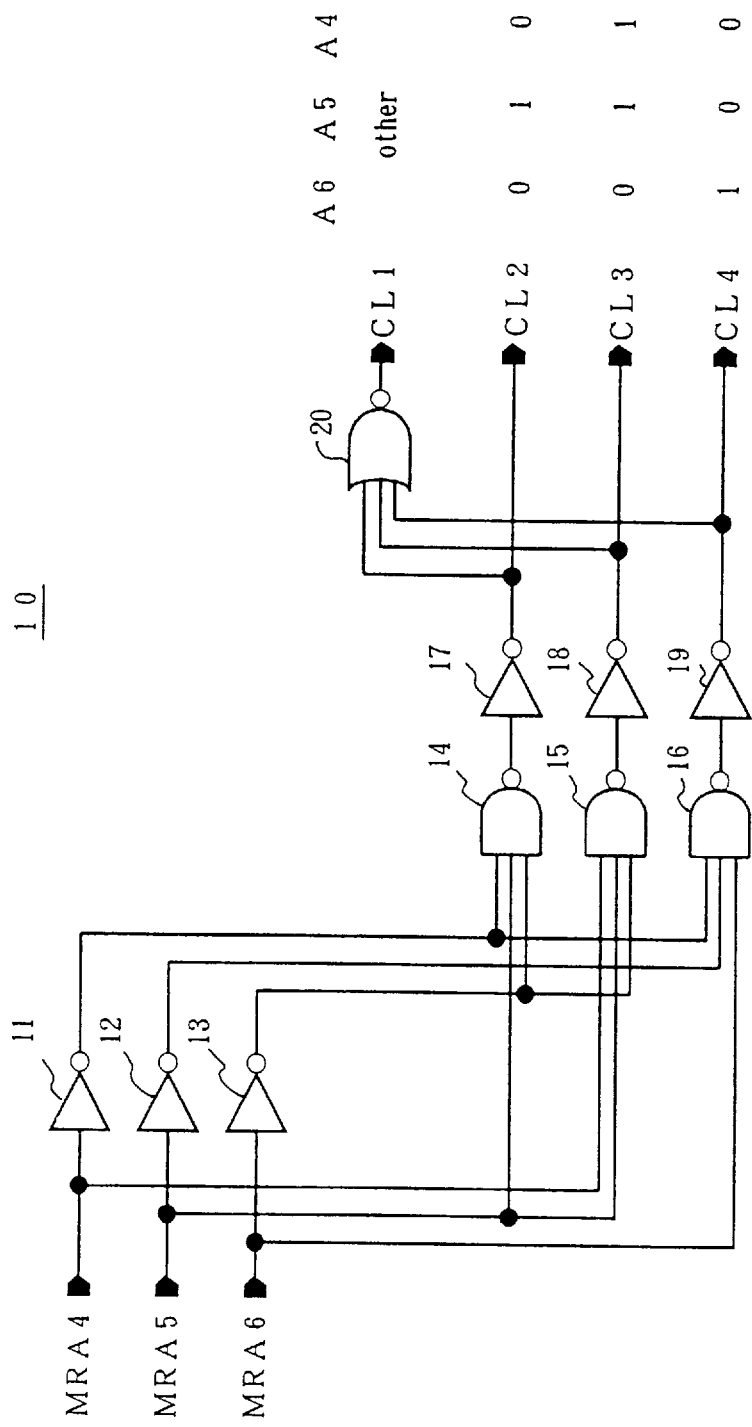
FIG. 3 is a circuit diagram of a latency decoder of an SDRAM according to a first embodiment of the present invention.

FIG. 3 is a circuit diagram of a latency decoder of an SDRAM according to a first embodiment of the present invention. The present invention is not limited to use in a latency decoder, but can be applied to other decoders for decoding setting data with regard to a mode register for setting an operation mode of a semiconductor device.

A latency decoder 10 of FIG. 3 includes inverters 11 through 13, NAND circuits 14 through 16, inverters 17 through 19, and a NOR circuit 20. The inverters 11 through 13 receive data bits MRA4 through MRA6, respectively, which are the address-input bits A4 through A6 held by latches of the mode resister. Each of the NAND circuits 14 through 16 receives a non-inverted bit or an inverted bit with respect to each of the data bits MRA4 through MRA6. The inverters 17 through 19 receive outputs of the NAND circuits 14 through 16, respectively, and invert these outputs.

The NOR circuit 20 receives the outputs of the inverters 17 through 19, and outputs a HIGH (selection) signal only when all the outputs of the inverters 17 through 19 are LOW (unselected). The output of the NOR circuit 20 constitutes the decode signal CL1, and the outputs of the inverters 17 through 19 are the decode signals CL2 through CL4, respectively. Conditions which make the decode signals CL1 through CL4 HIGH (selected) are shown by bit patterns of the address-input bits A4 through A6 alongside the decode signals CL1 through CL4 in the figure.

Figure 2:
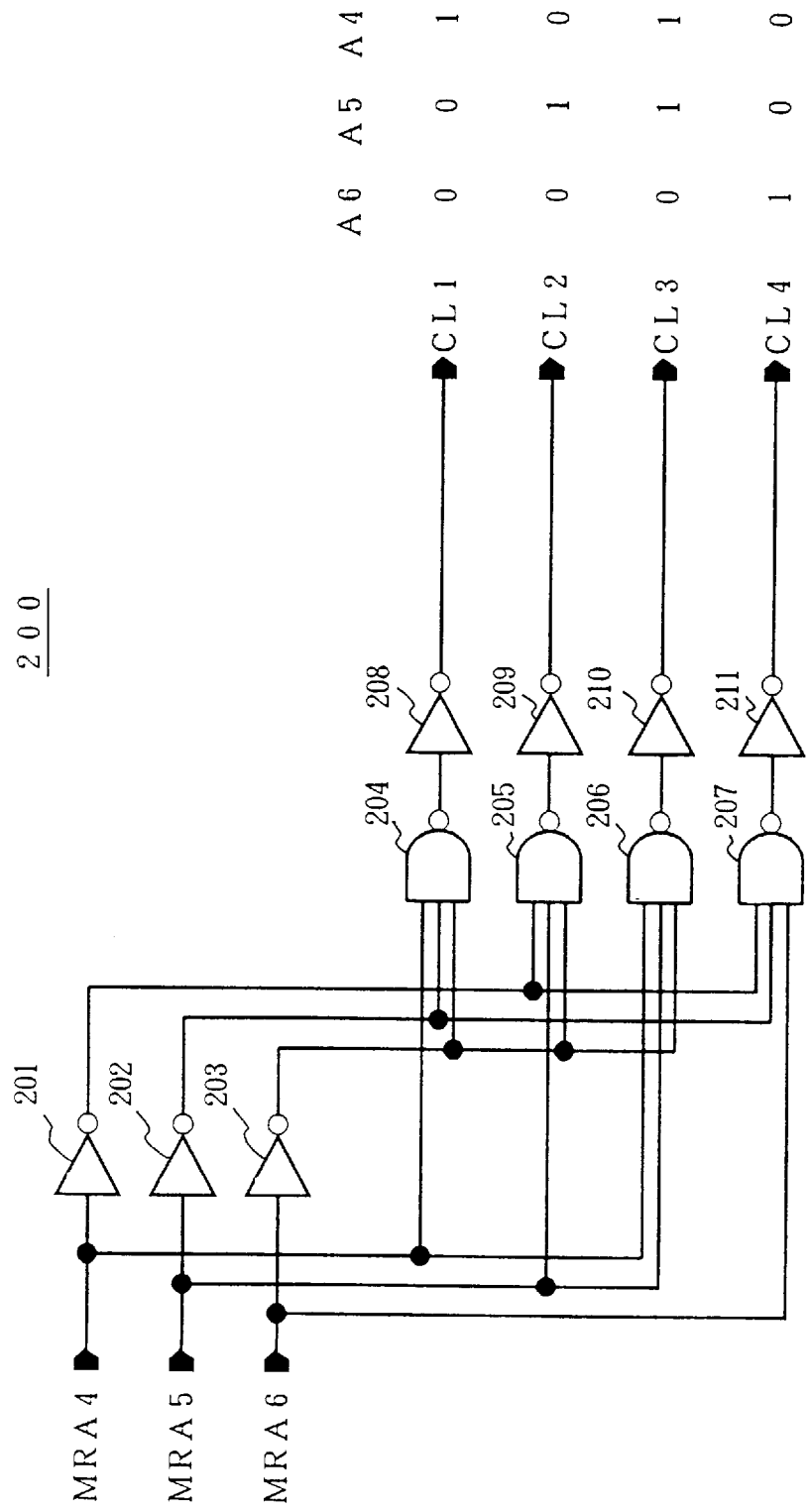
FIG. 2 is a circuit diagram of a conventional latency decoder.

Compared to the latency decoder 200 of FIG. 2, the latency decoder 10 of FIG. 3 according to the first embodiment has a different condition in which the decode signal CL1 is selected, i.e., the decode signal CL1 becomes HIGH when the decode signals CL2 through CL3 are not selected. Namely, the decode signal CL1 is selected when the address-input bits A4 through A6 are "100" as in the latency decoder 200 of FIG. 2, and, also, is selected when an undefined setting is made.

Accordingly, the use of a decoder having the configuration as shown in FIG. 3 makes it possible to avoid malfunction of a semiconductor device even when an undefined setting is made. This is achieved by allocating undefined settings to one of the defined outputs.

Figure 4:
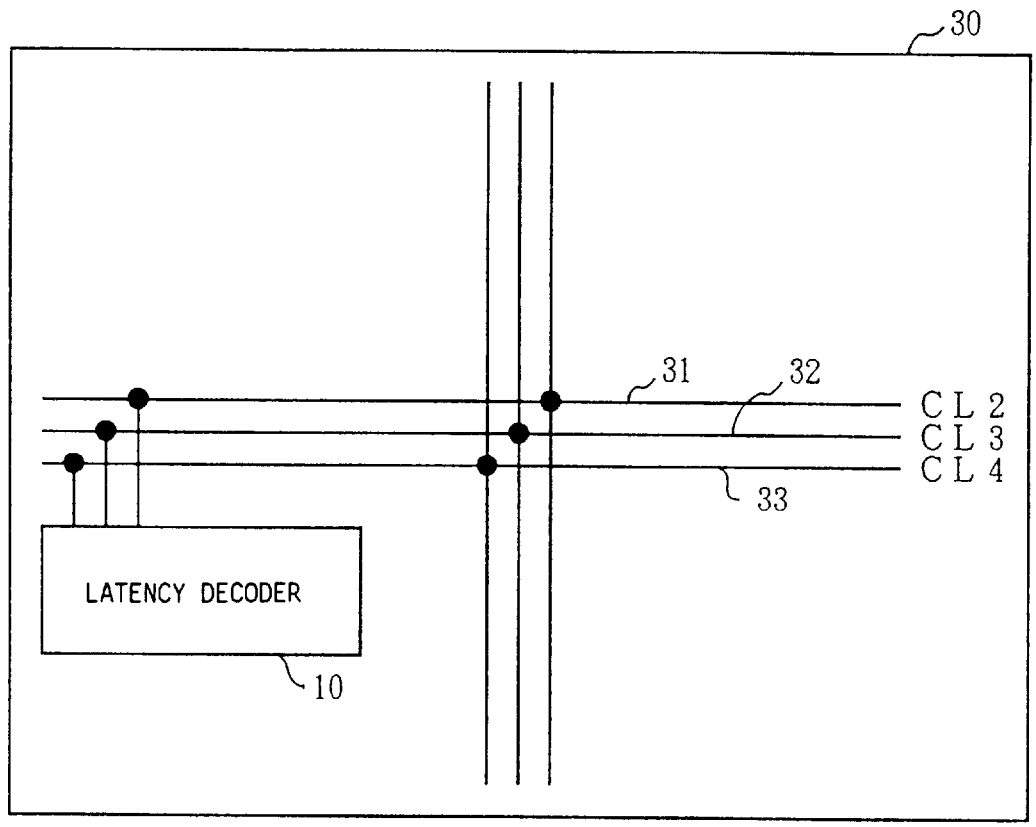
FIG. 4 is an illustrative drawing showing a layout of signal lines of latency-decode signals inside a semiconductor chip when the latency decoder of FIG. 3 is used.
Figure 5:
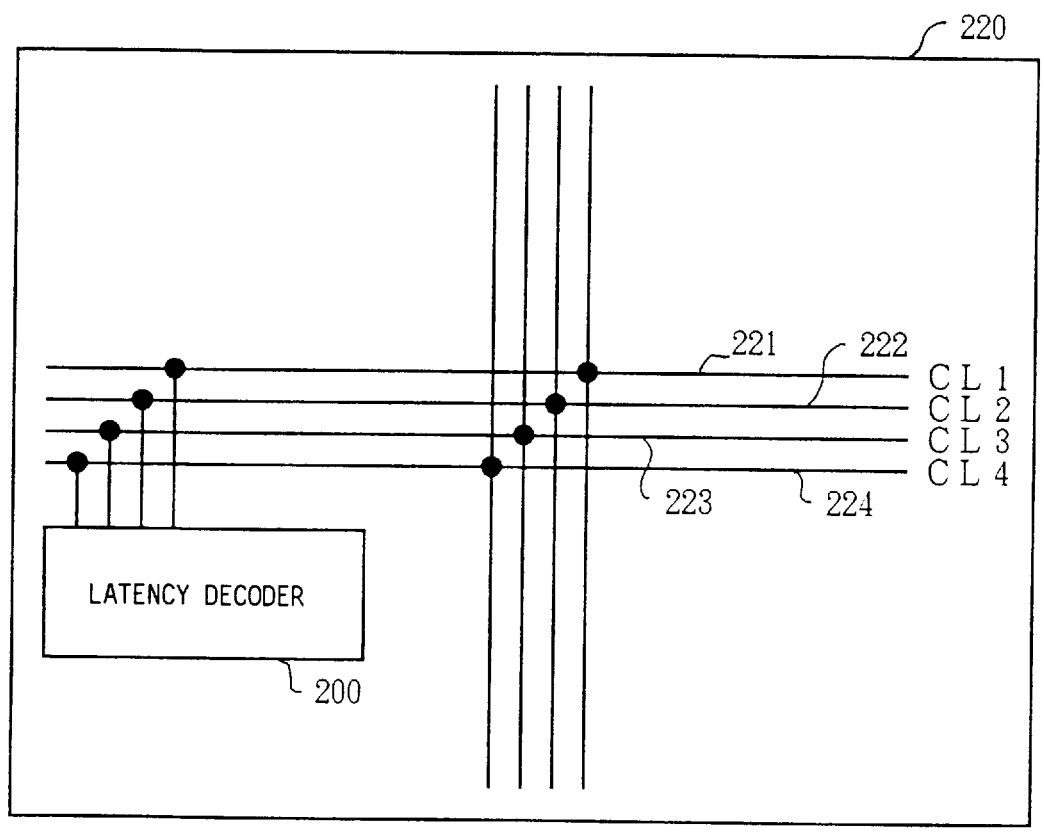
FIG. 5 is an illustrative drawing showing a conventional layout of signal lines of latency-decode signals inside a semiconductor chip when the latency decoder of FIG. 2 is used.

FIG. 4 is an illustrative drawing showing a layout of signal lines of latency-decode signals inside a semiconductor chip when the latency decoder 10 of FIG. 3 is used. FIG. 5 is an illustrative drawing showing a conventional layout of signal lines of latency-decode signals inside a semiconductor chip when the latency decoder 200 of FIG. 2 is used.

In the layout shown in FIG. 5, long-distance lines 221 through 224 are provided to transfer the decode signals CL1 through CL4 from the latency decoder 200 of FIG. 2 to other units inside a chip 220. On the other hand, the layout of FIG. 4 includes long-distance lines 31 through 33 to transfer only the decode signals CL2 through CL4 inside a chip 30 from the latency decoder 10 of FIG. 3. Since the decode signal CL1 is selected only when the decode signals CL2 through CL4 are unselected, there is no need to transfer the decode signal CL1 to other units via a long-distance line.

In each of the units using the latency-decode signals, the decode signal CL1 can be created based on the decode signals CL2 through CL4 sent from the latency decoder 10.

Figure 6:
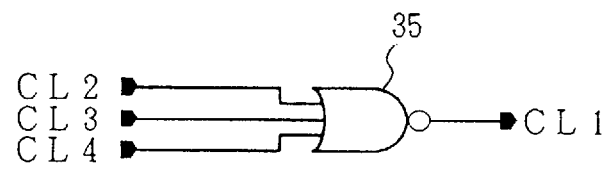
FIG. 6 is a circuit diagram of an example of a circuit which creates a decode signal CL1 by using decode signals CL2 through CL4.

FIG. 6 is a circuit diagram of an example of a circuit which creates the decode signal CL1 by using the decode signals CL2 through CL4. A NOR circuit 35 of FIG. 6 receives the decode signals CL2 through CL4, and outputs a HIGH (selection) signal only when all the received signals are LOW (unselected). Namely, the output of the NOR circuit 35 is the same as the decode signal CL1.

The circuit as shown in FIG. 6 can be provided for each unit which uses the latency decode signals, thereby eliminating a need to transfer the decode signal CL1 via a long-distance line. Since a long-distance line occupies a larger space than a simple circuit such as shown in FIG. 6, efficient use of space inside a chip is achieved by eliminating one of the long-distance lines by providing the circuit of FIG. 6 for each unit.

The NOR circuit 35 of FIG. 6 can be regarded as the NOR circuit 20 of FIG. 3 which is relocated from inside the mode register to each unit which requires the decode signals. Namely, when a layout as shown in FIG. 4 is used, the NOR circuit 20 of FIG. 3 is removed, and the NOR circuit 35 of FIG. 6 is provided for each unit as a substitute for the removed NOR circuit 20.

FIG. 7 is a block diagram showing a mode register and relating elements in an SDRAM according to a second embodiment of the present invention. FIG. 7 shows a command-signal-input node 102, an address-signal-input node 103, a mode-register controlling unit 110, and a mode register 111. The mode register 111 includes a latch control circuit 40, latches 230, a burst-length decoder 240, the latency decoder 200 of FIG. 2, and a burst-type decoder 250. The configuration of FIG. 7 is the same as that of a conventional mode register and relating elements, except that the latch control circuit 40 is newly provided.

Figure 1:
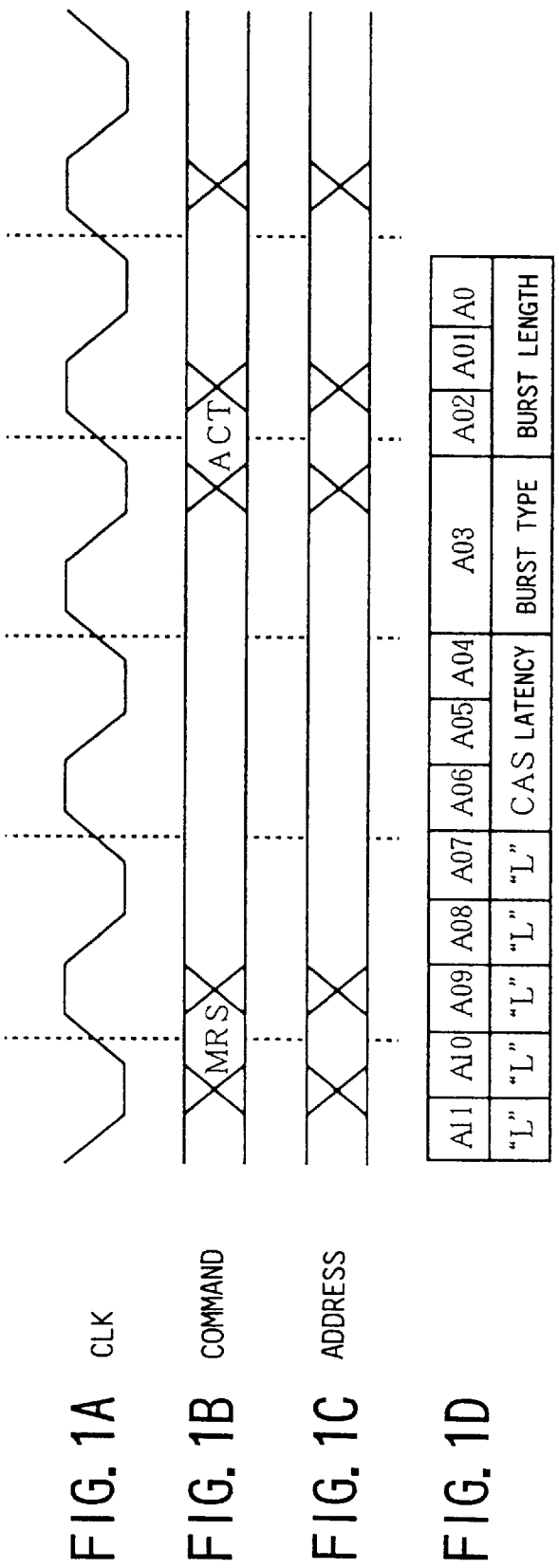
FIGS. 1A through 1D are illustrative drawings for explaining a mode-register-set operation with respect to a conventional 16M SDRAM.

A command signal (see FIG. 1B) input to the command-signal-input node 102 is supplied to the mode-register controlling unit 110. An address signal (see FIG. 1C) input to the address-signal-input node 103 is provided to the mode-register controlling unit 110 and the mode register 111. The mode-register controlling unit 110 outputs an enable signal rgwz in accordance with timing of the address signal when the received command signal instructs to set the mode register. In a conventional configuration, the enable signal rgwz received by the mode register 111 is directly supplied to the latches 230, and the latches 230 latch the address signal.

In the second embodiment of the present invention, the enable signal RGWZ received by the mode register 111 is first supplied to the latch control circuit 40. The latch control circuit 40 receives the address signal in addition to the enable signal rgwz, and determines based on the contents of the address signal whether to provide the enable signal rgwz to the latches 230. In detail, the latch control circuit 40 does not supply the enable signal rgwz to the latches 230 when the address signal shows a bit pattern of an undefined setting.

Figure 8:
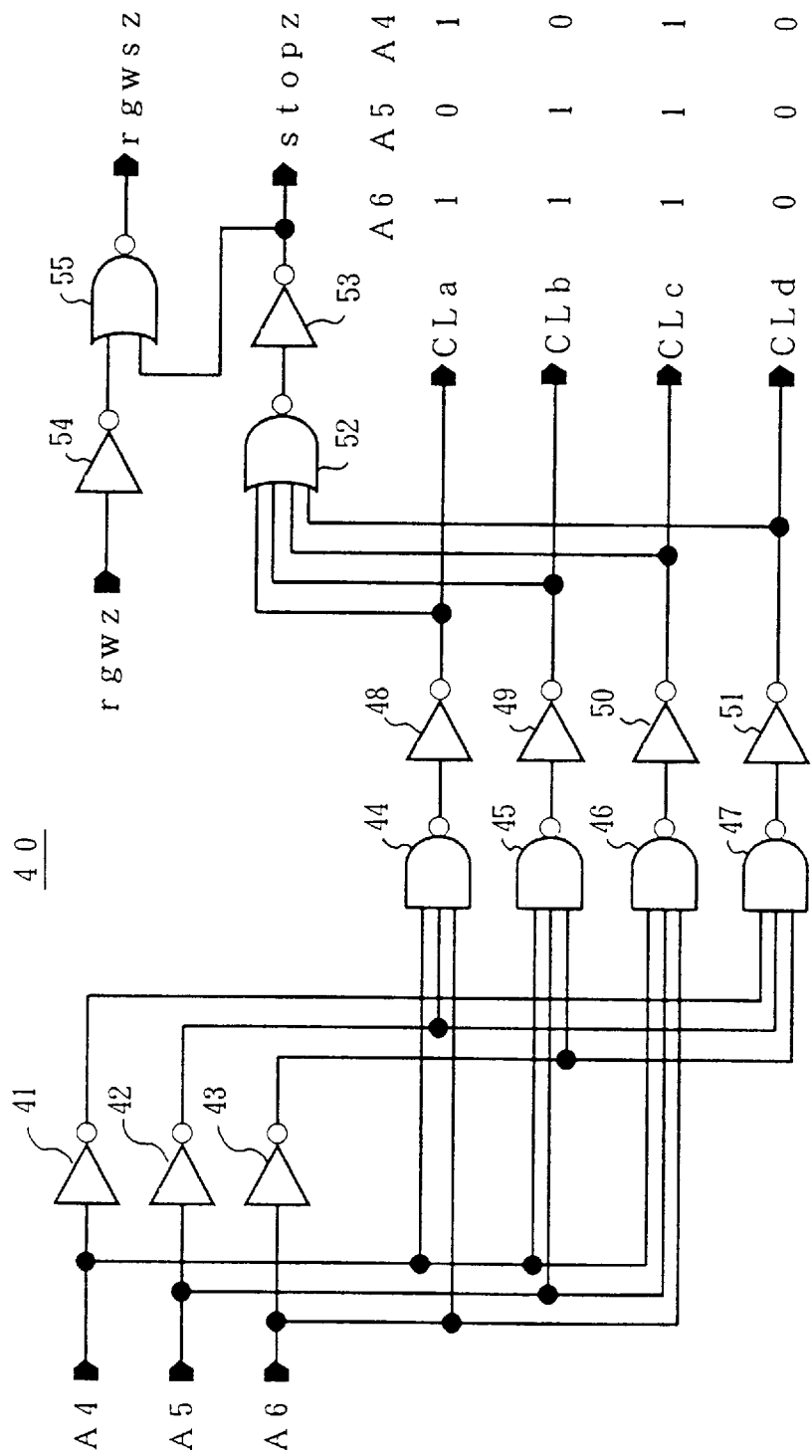
FIG. 8 is a circuit diagram of the latch control circuit of FIG. 7.

FIG. 8 is a circuit diagram of the latch control circuit 40. The latch control circuit 40 of FIG. 8 includes inverters 41 through 43, NAND circuits 44 through 47, inverters 48 through 51, a NOR circuit 52, inverters 53 and 54, and a NOR circuit 55. The inverters 41 through 43 receive the bits A4 through A6 of the address signal, respectively. Each of the NAND circuits 44 through 47 receives a non-inverted bit or an inverted bit with respect to each of the address-input bits A4 through A6. The inverters 48 through 51 receive outputs of the NAND circuits 44 through 47, respectively, and invert these outputs.

The outputs of the inverters 48 through 51 are decode signals CLa through CLd. Conditions in which these decode signals CLa through CLd are selected to turn into HIGH are shown in FIG. 8 as bit patterns of the address-input bits A4 through A6. As can be seen from a comparison with the bit patterns of the address-input bits A4 through A6 shown in FIG. 2, the bit patterns for the decode signals CLa through CLd of FIG. 8 correspond to undefined bit patterns. Namely, the inverters 48 through 51 of FIG. 8 produce outputs, one of which is HIGH when an undefined bit pattern is entered.

The NOR circuit 52 receives decode signals CLa through CLd. The NOR circuit 52 outputs a LOW signal when one of the decode signals CLa through CLd is HIGH, and outputs a HIGH signal when all the decode signals CLa through CLd are LOW. The inverter 53 inverts the output of the NOR circuit 52. An output of the inverter 53 is shown as a control signal stopz. The control signal stopz becomes HIGH when one of the decode signals CLa through CLd is HIGH, i.e., when an undefined input is made.

The control signal stopz is supplied to one input of the two-input NOR circuit 55. The other input of the NOR circuit 55 receives the inverse of the enable signal rgwz obtained by the inverter 54.

When the control signal stopz is HIGH, the output of the NOR circuit 55 is LOW at all the times. The enable signal rgwz is thus blocked by the NOR circuit 55. When the control signal stopz is LOW, the NOR circuit 55 serves as an inverter for the inverse of the enable signal rgwz. The NOR circuit 55 thus outputs the enable signal rgwz by inverting the inverse of the enable signal rgwz.

The output of the NOR circuit 55 is supplied to the latches 230 as a latch-control signal rgwsz (see FIG. 7). In this manner, the latch control circuit 40 blocks the enable signal rgwz when an undefined input is made, and outputs the enable signal rgwz as the latch-control signal rgwsz when a defined input is made. Having received the latch-control signal rgwsz, the latches 230 latch the address-input bits A0 through A06.

As described above, the mode register 111 according to the second embodiment of the present invention shown in FIG. 7 and FIG. 8 can avoid malfunction of an SDRAM when an undefined input is attempted because no setting is made to the CAS latency when an undefined input is made.

In the configuration shown in FIG. 7 and FIG. 8, when an undefined input is made with respect to a burst length, the undefined input is held by the latches 230, and is decoded by the burst-length decoder 240 to be output. (There is no undefined setting for a burst type since the burst type is represented by only one bit.) If one wishes to provide an anti-malfunction mechanism also for the burst length, therefore, one may modify the circuit of FIG. 8 so as to detect an undefined input with respect to the bits A0 through A2.

The second embodiment of the present invention has a configuration such that when an undefined input is made, data writing to the mode register is prohibited by detecting the undefined input. It is apparent that this configuration is not limited to application only to a mode register of SDRAMs, but can be applied to various semiconductor devices.

Figure 9:
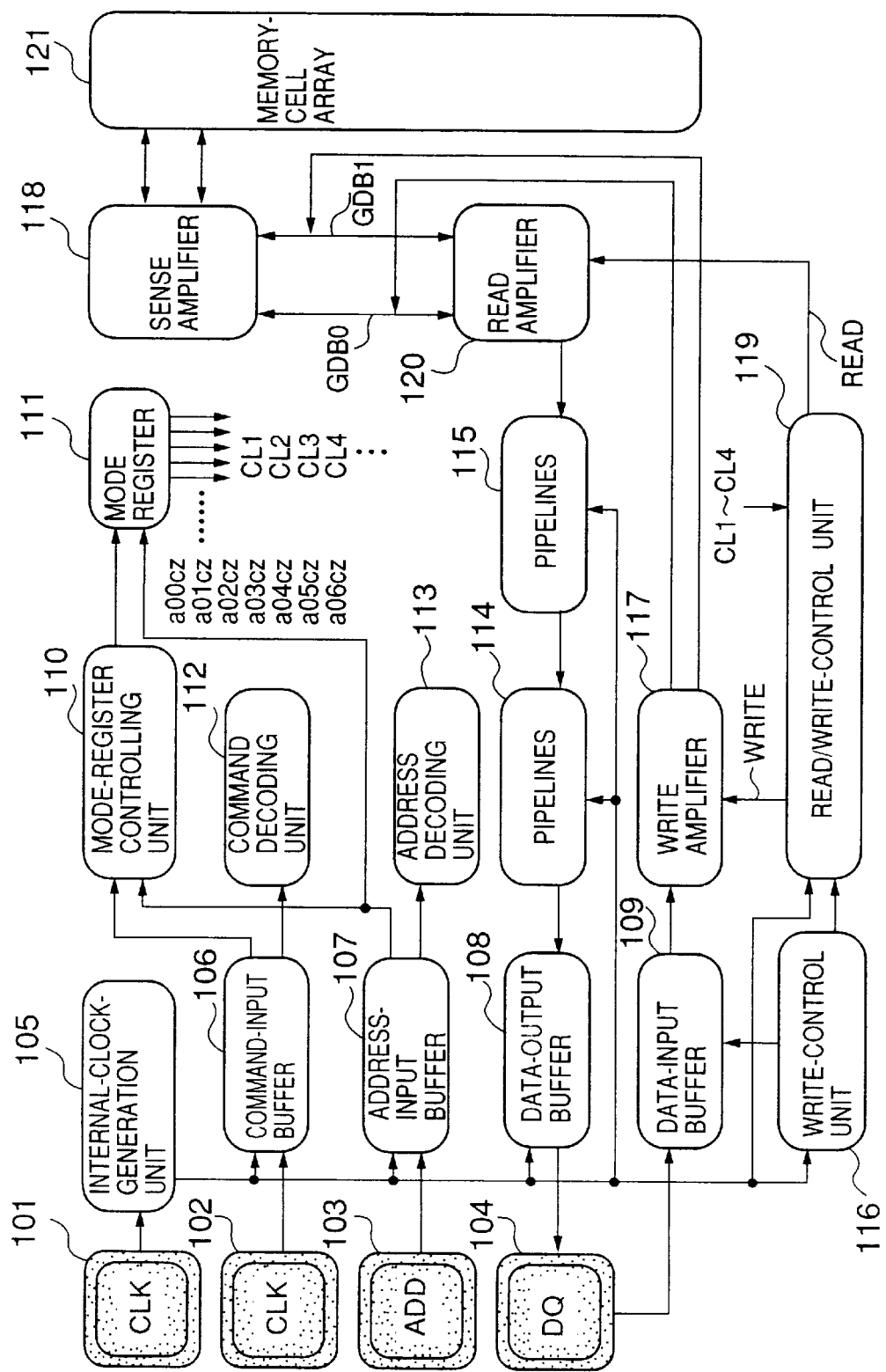
FIG. 9 is a block diagram of an SDRAM to which the mode register according to the second embodiment of the present invention is applied.

FIG. 9 is a block diagram of an SDRAM to which the mode register according to the second embodiment of the present invention is applied. The SDRAM of FIG. 9 includes a clock-signal-input node 101, the command-signal-input node 102, the address-signal-input node 103, a data-signal-input/output node 104, an internal-clock-generation unit 105, a command-input buffer 106, an address-input buffer 107, a data-output buffer 108, a data-input buffer 109, the mode-register controlling unit 110, the mode register 111 shown in FIG. 7, a command decoding unit 112, an address decoding unit 113, pipelines 114 and 115, a write-control unit 116, a write amplifier 117, a sense amplifier 118, a read/write-control unit 119, a read amplifier 120, and a memory-cell array 121.

The SDRAM of FIG. 9 has the same configuration as that of a conventional SDRAM, except that the mode register 111 of the present invention is used.

In the following, operations of the SDRAM of FIG. 9 will be described in brief. A clock signal input to the clock-signal-input node 101 is supplied to the internal-clock-generation unit 105, which generates various internal clock signals for controlling the internal circuits. Based on internal clock signals generated by the internal-clock-generation unit 105, the command-input buffer 106, the address-input buffer 107, and the data-input buffer 109 read a command signal, an address signal, and a data signal from the command-signal-input node 102, the address-signal-input node 103, and the data-signal-input/output node 104, respectively.

The command signal is supplied from the command-input buffer 106 to the command decoding unit 112 to be decoded. Based on the decoding results, the internal circuits are controlled. When a mode-register setting command is provided as a command, the mode-register controlling unit 110 writes an address signal from the address-input buffer 107 in the mode register 111 in response to the mode-register setting command.

The address signal is supplied from the address-input buffer 107 to the address decoding unit 113 for decoding. Based on the address decoding results, the memory-cell array 121 is accessed at an indicated address thereof.

The data signal is stored in the memory-cell array 121 at the indicated address thereof, supplied from the data-input buffer 109 via the write amplifier 117 and the sense amplifier 118. On the other hand, data read from the memory-cell array 121 at the indicated address thereof is supplied to the data-output buffer 108 via the sense amplifier 118, the read amplifier 120, and the pipelines 114 and 115. The data-output buffer 108 outputs the data to the data-signal-input/output node 104 based on an internal clock generated by the internal-clock-generation unit 105.

The write-control unit 116 supplies a control signal to the read/write-control unit 119 in accordance with the command decoding results of the command decoding unit 112. Also, based on the command decoding results, the write-control unit 116 controls the data-input buffer 109.

The read/write-control unit 119 generates control signals such as a write signal Write, a read signal Read, a column-line selecting signal (not shown), etc. The column-line selecting signal, for example, is supplied to the sense amplifier 118 which is comprised of a plurality of sense amplifiers, and allows data to be written in or read from selected sense amplifiers for a predetermined time period. The write signal Write is supplied to the write amplifier 117 so as to provide the input data from the data-input buffer 109 to global data bus GDB0 and GDB1 at a predetermined timing. The read signal Read is supplied to the read amplifier 120 so as to provide the read data from the global data bus GDB0 and GDB1 to the pipeline 115 at a predetermined timing.

The mode register 111 stores settings of the burst length, the burst type, the CAS latency, etc., as previously described. As for the CAS latency, for example, the mode register 111 outputs the CAS-latency indicating signals (decode signals) CL1 through CL4 for indicating which CAS latency is being used. (When the number of CAS latencies which can be set is more than 4, a CAS-latency indicating signal CL5 and so on are also generated.) Based on the CAS-latency indicating signals CL1 through CL4, the read/write-control unit 119 controls the timing of a data-read operation.

As described in connection with FIG. 7 and FIG. 8, when an attempt is made to set an undefined CAS latency in the mode register 111, this undefined CAS latency is prevented from being written in the mode register 111. In the SDRAM of FIG. 9, therefore, a malfunction can be avoided even when an undefined input is attempted for the CAS latency. Further, it is obvious that the function of preventing undefined input can be provided for other parameters such as a parameter for the burst length in addition to the CAS latency.

In the SDRAM of FIG. 9, the mode register 111 of FIG. 7 may be replaced by a conventional mode register, and the latency decoder of FIG. 3 may be provided in this replacing mode register. In this case, when an undefined setting is attempted for the CAS latency, the CAS-latency indicating signal CL1, for example, is selected, thereby avoiding a malfunction of the SDRAM. In this configuration, signal lines inside the SDRAM for transferring the CAS-latency indicating signals may be provided only for the CAS-latency indicating signals CL2 through CL4, and the NOR circuit of FIG. 6 may be provided in relevant circuit units such as the read/write-control unit 119.

Further, the present invention is not limited to these embodiments, but variations and modifications may be made without departing from the scope of the present invention.

What is claimed is:

1. A semiconductor device which allows an input signal thereto to select one of N operation modes, and operates in said one of N operation modes, said semiconductor device comprising:

a selection circuit for selecting an operation mode from said N operation modes when said input signal indicates said operation mode, and for selecting a predetermined operation mode from said N operation modes when said input signal is an undefined signal indicating none of said N operation modes; and an internal circuit operating in one of said operation mode and said predetermined operation mode selected by said selection circuit,
wherein selection of said predetermined operation mode prevents malfunction of said internal circuit when said input signal is said undefined signal.

2. The semiconductor device as claimed in claim 1, wherein said selection circuit comprises:

a first circuit for selecting one of predetermined N−1 operation modes among said N operation modes by decoding said input signal; and a second circuit for selecting, based on logic operation of outputs of said first circuit, a remaining operation mode of said N operation modes when none of said predetermined N−1 operation modes is selected.

3. The semiconductor device as claimed in claim 2, wherein said selection circuit further comprises N−1 signal lines connecting between said first circuit and said second circuit, and said second circuit is located in a proximity of said internal circuit or within said internal circuit.

4. The semiconductor device as claimed in claim 1, wherein said selection circuit comprises:

a third circuit for detecting said undefined signal;

a fourth circuit, responsive to an output from said third circuit, for storing said input signal when said input signal is not said undefined signal, and for holding a currently stored input signal when said input signal is said undefined signal; and a fifth circuit for selecting one of said N operation modes by decoding said input signal stored in said fourth circuit.

5. A semiconductor device which allows an input signal thereto to select one of N operation modes, and operates in said one of N operation modes, said semiconductor device comprising:

a selection circuit for selecting an operation mode from said N operation modes when said input signal indicates said operation mode, and for selecting a predetermined operation mode from said N operation modes when said input signal is an undefined signal indicating none of said N operation modes;

a core circuit for storing data; and a control circuit operating in one of said operation mode and said predetermined operation mode selected by said selection circuit to control said core circuit, wherein selection of said predetermined operation mode prevents malfunction of said control circuit when said input signal is said undefined signal.

6. The semiconductor device as claimed in claim 5, wherein said selection circuit comprises:

a first circuit for selecting one of predetermined N−1 operation modes among said N operation modes by decoding said input signal; and a second circuit for selecting, based on logic operation of outputs of said first circuit, a remaining operation mode of said N operation modes when none of said predetermined N−1 operation modes is selected.

7. The semiconductor device as claimed in claim 6, wherein said selection circuit further comprises N−1 signal lines connecting between said first circuit and said second circuit, and said second circuit is located in a proximity of said control circuit or within said control circuit.

8. The semiconductor device as claimed in claim 5, wherein said selection circuit comprises:

a third circuit for detecting said undefined signal;

a fourth circuit, responsive to an output from said third circuit, for storing said input signal when said input signal is not said undefined signal, and for holding a currently stored input signal when said input signal is said undefined signal; and a fifth circuit for selecting one of said N operation modes by decoding said input signal stored in said fourth circuit.

9. A method of selecting one of a plurality of operation modes in a semiconductor device by using an input signal, said method comprising the steps of:

selecting an operation mode from said plurality of operation modes when said input signal indicates said operation mode; and selecting a predetermined operation mode from said plurality of operation modes when said input signal is an undefined signal indicating none of said plurality of operation modes.

10. A method of selecting one of N operation modes in a semiconductor device by using an input signal, said method comprising the steps of:

selecting one of predetermined N−1 operation modes among said N operation modes by decoding said input signal; and selecting a remaining operation mode of said N operation mode when none of said N−1 operation modes is selected.

11. A method of selecting one of a plurality of operation modes in a semiconductor device by using an input signal, said method comprising the steps of:

detecting whether said input signal is an undefined signal indicating none of said plurality of operation modes;

storing said input signal to a register when said input signal is not an undefined signal;

holding said input signal currently stored in said register when said input signal is an undefined signal; and selecting one of said plurality of operation modes by decoding said input signal stored in said register.

* * * * *